US012573599B2

(12) United States Patent
Ishigami et al.

(10) Patent No.: US 12,573,599 B2
(45) Date of Patent: Mar. 10, 2026

(54) PLASMA PROCESSING DEVICE AND PLASMA PROCESSING METHOD

(71) Applicant: Tokyo Electron Limited, Tokyo (JP)

(72) Inventors: Katsutoshi Ishigami, Fuchu (JP); Takeshi Ishida, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 659 days.

(21) Appl. No.: 17/904,321

(22) PCT Filed: Feb. 15, 2021

(86) PCT No.: PCT/JP2021/005553
§ 371 (c)(1),
(2) Date: Aug. 16, 2022

(87) PCT Pub. No.: WO2021/172074
PCT Pub. Date: Sep. 2, 2021

(65) Prior Publication Data
US 2023/0056750 A1 Feb. 23, 2023

(30) Foreign Application Priority Data

Feb. 26, 2020 (JP) ................................. 2020-030328

(51) Int. Cl.
*H01J 37/32* (2006.01)
*C23C 16/44* (2006.01)
(52) U.S. Cl.
CPC .... *H01J 37/32834* (2013.01); *C23C 16/4412* (2013.01); *H01J 37/32449* (2013.01); *H01J 37/32633* (2013.01); *H01J 37/32899* (2013.01)

(58) Field of Classification Search
CPC ................ C23C 16/44; C23C 16/4412; C23C 16/45591; C23C 16/505; H01J 37/32449; H01J 37/32633; H01J 37/32834; H01J 37/32871; H01J 37/32899; H01L 21/3065; H01L 21/31; H01L 21/67017
See application file for complete search history.

(56) References Cited

U.S. PATENT DOCUMENTS 4,539,934 A * 9/1985 Fujiyama ................ H01J 37/18
118/50.1
6,332,925 B1 * 12/2001 Noji ..................... B01D 53/002
62/55.5

(Continued)

FOREIGN PATENT DOCUMENTS

JP 2003-249487 A 9/2003
JP 2005-163062 A 6/2005

(Continued)

*Primary Examiner* — Benjamin Kendall
(74) *Attorney, Agent, or Firm* — Armstrong Teasdale LLP

(57) ABSTRACT

A plasma processing device includes: a plurality of processing chambers; a junction exhaust pipe into which a plurality of exhaust flow paths for evacuating interiors of the plurality of processing chambers joins; and a plurality of branch exhaust pipes disposed between the plurality of exhaust flow paths and the junction exhaust pipe and connecting the junction exhaust pipe to the plurality of exhaust flow paths, respectively, wherein each of the plurality of branch exhaust pipes includes a mechanism, which is disposed in a flow path of the branch exhaust pipe, to deactivate energy of hot electrons flowing through the flow path.

8 Claims, 6 Drawing Sheets

(56)                  References Cited

U.S. PATENT DOCUMENTS

| | | | | | |
|---|---|---|---|---|---|
| 6,843,882 | B2 * | 1/2005 | Janakiraman | ....... | C23C 16/4412 |
| | | | | | 156/345.31 |
| 7,559,992 | B2 * | 7/2009 | Suzuki | ............. | H01L 21/67017 |
| | | | | | 134/1.1 |
| 9,702,285 | B2 * | 7/2017 | Hayashi | .................... | F01N 3/08 |
| 11,594,400 | B2 * | 2/2023 | Bise | ................. | H01J 37/32541 |
| 2004/0182833 | A1 * | 9/2004 | Fink | ................... | C23C 16/4404 |
| | | | | | 219/121.43 |
| 2011/0075313 | A1 * | 3/2011 | Comendant | ....... | H01L 21/67069 |
| | | | | | 361/121 |
| 2015/0300227 | A1 * | 10/2015 | Hayashi | ................ | B01D 45/08 |
| | | | | | 55/342.2 |

FOREIGN PATENT DOCUMENTS

| | | | |
|---|---|---|---|
| JP | 2018-141177 | A | 9/2018 |
| JP | 2019-087576 | A | 6/2019 |
| JP | 2019-220509 | A | 12/2019 |
| KR | 10-2011-0047085 | A | 5/2011 |
| KR | 10-2019-0142211 | A | 12/2019 |

* cited by examiner

```
                                    MT ( Start )

│
    ┌────────────┼────────────────────────┐
    │            ▼                          
    │  ┌──────────────────────────┐    S10
    │  │  Placing substrate on stage │
    │  └──────────────────────────┘
    │            │
    │            ▼
    │  ┌──────────────────────────┐    S12
    │  │ Controlling temperature of │
    │  │      stage by heater       │
    │  └──────────────────────────┘
    │            │
    │            ▼
    │  ┌──────────────────────────┐    S14
    │  │ Controlling pressure in    │
    │  │ reactor by pressure        │
    │  │ regulator and performing   │
    │  │ exhaust                    │
    │  └──────────────────────────┘
    │            │
    │            ▼              S16
    │        ◇─────────────────────◇   Yes
    │       Is number of reactors larger ──────┐
    │       than number of substrates?         │    S18
    │        ◇─────────────────────◇           ▼
    │            │ No              ┌──────────────────────────┐
    │            │                 │ Supplying plasma           │
    │            │◄────────────────│ suppression gas            │
    │            │                 └──────────────────────────┘
    │            ▼
    │  ┌──────────────────────────┐    S20
    │  │   Supplying processing gas  │
    │  └──────────────────────────┘
    │            │
    │            ▼
    │  ┌──────────────────────────┐    S22
    │  │ Applying radio-frequency    │
    │  │         power               │
    │  └──────────────────────────┘
    │            │◄──────────────────────────┐
    │            ▼                            │
    │  ┌──────────────────────────┐    S24    │
    │  │ Processing substrate with   │        │
    │  │ plasma of processing gas    │        │
    │  └──────────────────────────┘          │
    │            │                            │
    │            ▼              S26            │
    │        ◇─────────────────────◇   No     │
    │       Is substrate processing   ────────┘
    │            completed?
    │        ◇─────────────────────◇
    │            │ Yes            S28
    │            ▼
    │        ◇─────────────────────◇
    │  No    Is lot processing completed?
    └────────◇─────────────────────◇
                 │ Yes
                 ▼
             ( End )
```

PLASMA PROCESSING DEVICE AND PLASMA PROCESSING METHOD

CROSS-REFERENCE TO RELATED APPLICATIONS

The present application is a U.S. National Stage Entry of International Patent Application No. PCT/JP2021/005553, filed Feb. 15, 2021, which claims the benefit of priority to Japanese Patent Application No. 2020-030328, filed Feb. 26, 2020, each of which is hereby incorporated herein by reference in its entirety.

TECHNICAL FIELD

The present disclosure relates to a plasma processing device and a plasma processing method.

BACKGROUND

For example, Patent Document 1 recites a processing chamber that performs a plasma etching process and an automatic pressure control device that is connected to the processing chamber via an exhaust pipeline and controls the internal pressure of the processing chamber. The exhaust pipeline includes therein an exhaust ring arranged on the processing chamber side and a plurality of cylindrical bodies arranged in an arc shape inside the exhaust pipeline. The exhaust pipeline includes a manifold arranged on the automatic pressure control device side and a plurality of plasma leakage prevention plates interposed between the exhaust ring and the manifold and arranged to form a shape corresponding to the manifold so as to close the manifold. It is proposed that the plasma leakage prevention plates have a plurality of holes arranged substantially over the whole and suppress the passage of plasma generated in the processing chamber.

For example, Patent Document 2 proposes a type of an apparatus that includes a plurality of processing chambers and causes a raw material gas to react with a reactive gas to form a film, wherein four wafers are processed at the same time in one chamber.

PRIOR ART DOCUMENTS

Patent Documents

Patent Document 1: Japanese laid-open publication No. 2003-249487

Patent Document 2: Japanese laid-open publication No. 2019-87576

The present disclosure provides a technique capable of preventing plasma interference via exhaust spaces in a plurality of processing chambers having a common exhaust flow path.

SUMMARY

According to one embodiment of the present disclosure, there is provided a plasma processing device including: a plurality of processing chambers; a junction exhaust pipe into which a plurality of exhaust flow paths for evacuating interiors of the plurality of processing chambers joins; and a plurality of branch exhaust pipes disposed between the plurality of exhaust flow paths and the junction exhaust pipe and connecting the junction exhaust pipe to the plurality of exhaust flow paths, respectively, wherein each of the plurality of branch exhaust pipes includes a mechanism, which is disposed in a flow path of the branch exhaust pipe, to deactivate energy of hot electrons flowing through the flow path.

According to an aspect, it is possible to prevent plasma interference via exhaust spaces in a plurality of processing chambers having a common exhaust flow path.

BRIEF DESCRIPTION OF DRAWINGS

FIG. 3A is a view illustrating plasma interference due to an exhaust route according to the comparative example.

FIG. 3B is a view illustrating for explaining prevention of plasma interference by an exhaust route according to the embodiment.

FIG. 3C is a view illustrating for explaining prevention of plasma interference by an exhaust route according to the embodiment.

FIG. 5 is a flowchart illustrating a plasma processing method according to an embodiment.

DETAILED DESCRIPTION

Figure 1:
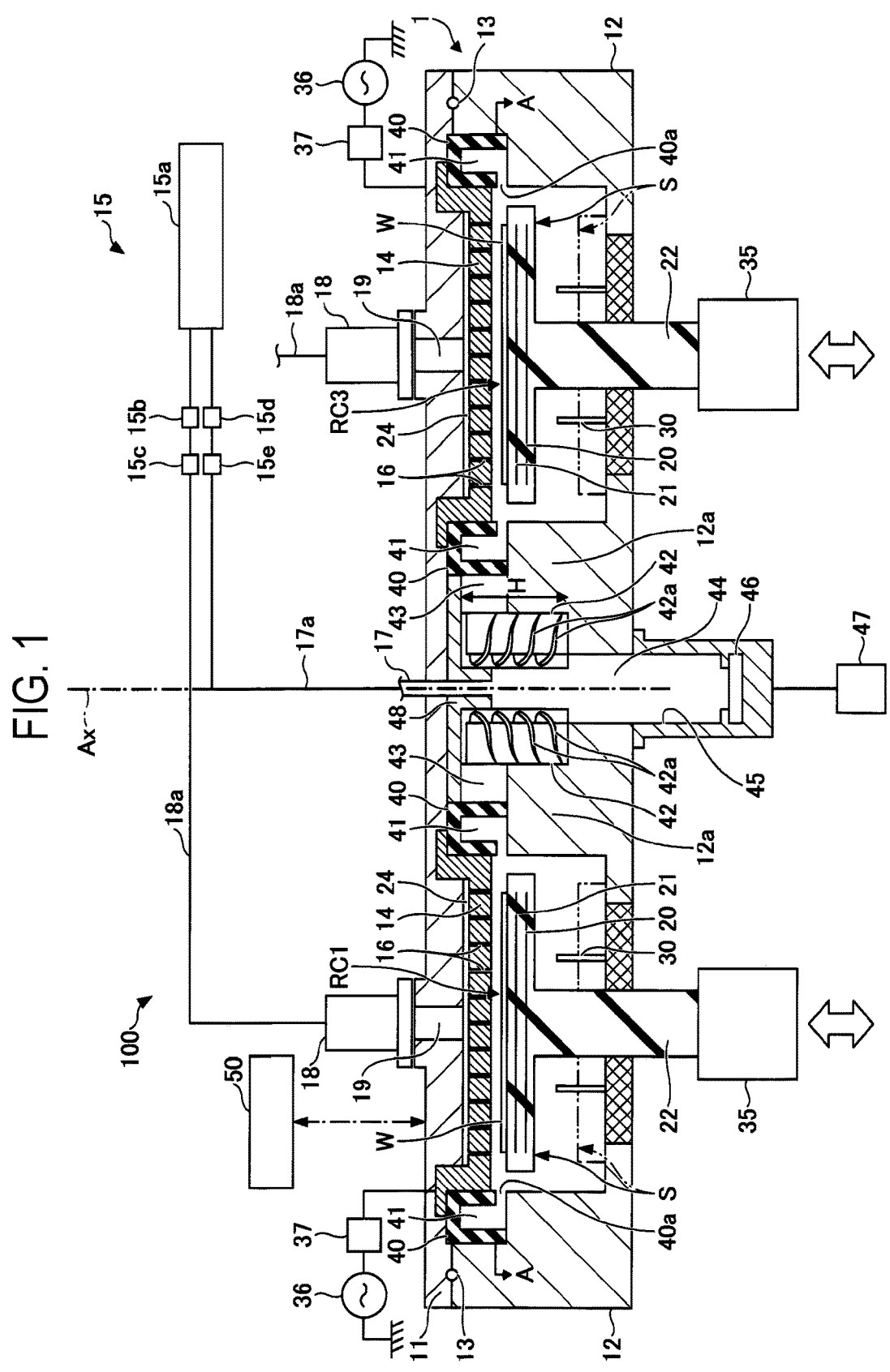
FIG. 1 is a schematic cross-sectional view illustrating a plasma processing device according to an embodiment.

Hereinafter, embodiments of the present disclosure will be described with reference to the accompanying drawings. In each of the drawings, the same components may be denoted by the same reference numerals, and redundant descriptions thereof may be omitted.

[Plasma Processing Device]

A plasma processing device 100 according to an embodiment will be described with reference to FIG. 1. FIG. 1 is a schematic cross-sectional view illustrating an example of a plasma processing device 100 according to an embodiment. The plasma processing device 100 includes a chamber 1. The chamber 1 includes a container 12 and a lid 11. The container 12 and the lid 11 are made of, for example, aluminum. The lid 11 is provided in the upper opening of the container 12 having a bottom portion. An O-ring 13 is provided between the container 12 and the lid 11, whereby a processing chamber in the chamber 1 is kept airtight. A film having corrosion resistance to plasma may be formed on the inner walls of the container 12 and the lid 11. The film may be ceramic such as aluminum oxide or yttrium oxide.

The container 12 is provided with four reactors RC1 to RC4, of which two reactors RC1 and RC3 are illustrated in FIG. 1. Hereinafter, the reactors RC1 to RC4 are also collectively referred to as a reactor RC. The four reactors RC are an example of a plurality of processing chambers. The number of reactors RC is not limited to four, and may be two or three or more.

A stage S on which a substrate W is placed is provided in each reactor RC. An example of the substrate W is a wafer. The stage S has a substantially disk-like shape, and is formed of a dielectric material such as alumina ($Al_2O_3$). A heater 20 is embedded inside the stage S. The heater 20 is constituted with, for example, a ceramic sheet-shaped or plate-shaped resistance heating element. The heater 20 is supplied with power from a power supply to generate heat and heats a placement surface of the stage S, thereby heating the substrate W to a process temperature suitable for film formation. For example, the heater 20 heats the substrate W placed on the stage S to 100 degrees C. to 300 degrees C. A mesh-shaped metal electrode plate 21 is embedded in the stage S.

The stage S has a support 22. The support 22 penetrates the bottom of the container 12 and is supported by a lifting mechanism 35. By the lifting mechanism 35, the stage S is moved up and down between a processing position of a substrate W (the position indicated by the solid line in FIG. 1) and a delivery position of a substrate W (the position indicated by the alternate long and two short dashes line in FIG. 1). The lifting mechanism 35 allows the distance (gap) between the stage S and the upper electrode 14 to be adjusted.

In a state in which the stage S is moved from the processing position of the substrate W to the delivery position, the substrate W is delivered to and from an external transport mechanism through the carry-in/out port. In the stage S, through holes, through which the shafts of lifting pins 30 are inserted, respectively, are formed. The heads of the lifting pins 30 protrude from the placement surface of the stage S, whereby the lifting pins 30 lift the substrate W from the placement surface of the stage S and deliver the substrate W to the transport mechanism.

One upper electrode 14 is provided in each reactor RC. The upper electrode 14 is installed at a position facing each stage S and is supported by the lid 11. The upper electrode 14 is formed of a conductor such as aluminum and has a substantially disk-like shape. The upper electrode 14 has a plurality of gas supply holes 16. With such a configuration, the upper electrode 14 functions as a gas shower head. The stage S functions as a lower electrode facing the upper electrode 14.

A gas supplier 15 includes a gas source 15a, a flow rate controllers 15b and 15d, and valves 15c and 15e. The flow rate of a processing gas (a raw material gas or a reactive gas) output from the gas source 15a is adjusted by the flow rate controller 15b, and then the adjusted processing gas is introduced into a gas introduction port 18 via a gas line 18a at the timing of opening the valve 15c. The introduced processing gas passes through a through hole 19 formed in the lid 11 and a flow path 24 formed between the top surface of the upper electrode 14 and the bottom surface of the lid 11, and is introduced into the container 12 from the plurality of gas supply holes 16.

A radio-frequency power supply 36 is connected to each upper electrode 14 via a matcher 37, and radio-frequency power having a frequency of, for example, 0.4 MHz to 2,450 MHz is applied from the radio-frequency power supply 36 to the upper electrode 14. The processing gas introduced into the container 12 is turned into plasma by radio-frequency power from the radio-frequency power supply 36. With the plasma generated in the space between the upper electrode 14 and the stage S, a process such as a film forming process is performed on the substrate W on the stage S.

A recess is formed in the side wall of the container 12 above the stage S and on the outer periphery of the upper electrode 14. An annular exhaust manifold 40 is arranged in the recess of the side wall to surround the upper electrode 14. The exhaust manifold 40 is made of ceramic. The exhaust manifold 40 forms an exhaust flow path 41 of a gas in the circumferential direction.

In the reactors RC1 to RC4, a processing gas is supplied from four upper electrodes 14 and radio-frequency power is applied from four radio-frequency power supplies 36 so that four substrates W can be processed at the same time. The gas in the container 12 flows into the exhaust flow paths 41 through slit-shaped gaps 40a communicating with the exhaust flow paths 41 of the exhaust manifolds 40.

Figure 2:
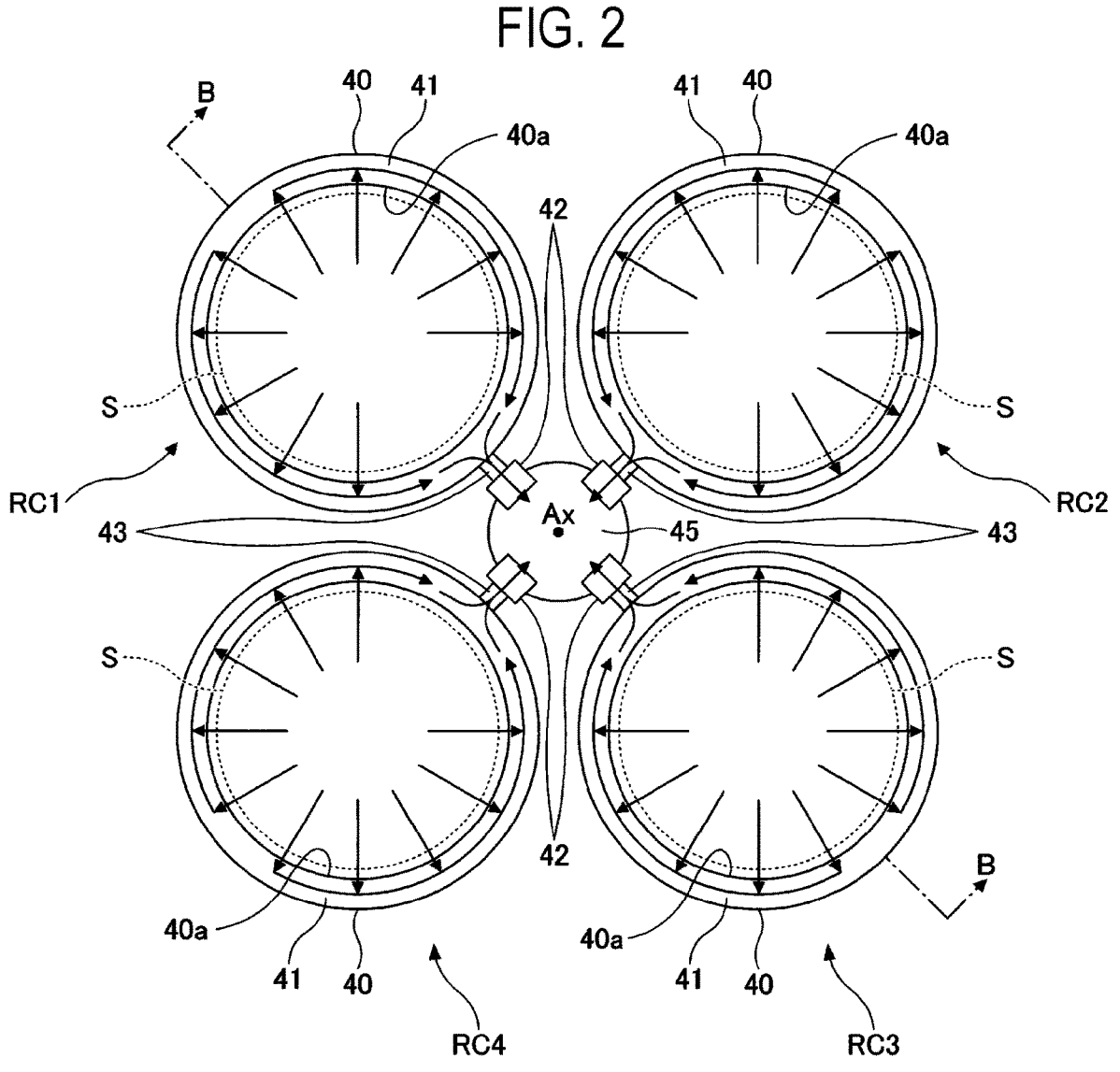
FIG. 2 is a view for explaining an exhaust flow path according to an embodiment.

Referring to FIG. 1 and FIG. 2 illustrating the A-A cross section of FIG. 1, the gas above each of the stages S of the reactors RC1 to RC4 flows into the exhaust flow path 41 from the slit-shaped gap 40a formed at the lateral side above each stage S, and flows in the exhaust flow paths 41 from the exterior to the interior of the container 12. The reactors RC1 to RC4 are symmetrically arranged around the central axis AX of the plasma processing device 100 at an angle of about 90°.

Exhaust flow paths 43 penetrate the container 12 of the reactors RC1 to RC4 toward the central axis AX. One ends of the exhaust flow paths 43 are connected to the exhaust manifolds 40, respectively, and the other ends are connected to branch exhaust pipes 42, respectively. That is, the branch exhaust pipes 42 are arranged between the plurality of exhaust flow paths 41 and 43 and the junction exhaust pipe 45, into which the plurality of exhaust flow paths 41 and 43 for evacuating the interior of the reactors RC1 to RC4 join, and interconnect the plurality of exhaust flow paths 41 and 43 and the junction exhaust pipe 45. With this configuration, the junction exhaust pipe 45 becomes a common exhaust pipe that bundles the four branch exhaust pipes 42.

The four branch exhaust pipes 42 are fixed between a fixing member 48, which is in contact with the bottom surface of the lid 11 among the upper electrodes 14 and protrudes in the central portion of the bottom surface of the lid 11, and a step portion formed in inner side walls 12a of the container 12 among the reactors RC1 to RC4. The flow paths of the four branch exhaust pipes 42 are connected to the flow path of the junction exhaust pipe 45 via an internal flow path 44 that vertically penetrates respective inner side walls 12a of the container 12.

A pressure regulator 46 includes a valve for adjusting an exhaust flow rate (e.g., an auto pressure controller (APC)) and a pressure gauge (e.g., a capacitance manometer) and adjusts the exhaust flow rate of an exhaust apparatus 47 to adjust the pressure in the reactors RC1 to RC4. By the pressure regulator 46 and the exhaust apparatus 47, the pressure inside the reactors RC1 to RC4 is reduced to a desired degree of vacuum. In addition, by the operation of the exhaust apparatus 47, gas is exhausted from the outer periphery above the stages S through the exhaust flow paths 41 and 43, the flow paths of the branch exhaust pipes 42, the internal flow path 44, and the flow path of the junction exhaust pipe 45.

A gas introduction pipe 17 penetrates the lid 11 and the fixing member 48 and is connected to the gas supplier 15 via a gas line 17a. The gas introduction pipe 17 introduces a gas for suppressing the generation of plasma (hereinafter, referred to as "plasma suppression gas") into the internal flow path 44 and the junction exhaust pipe 45.

The plasma suppression gas output from the gas source 15a is subjected to flow rate adjustment by the flow rate controller 15d and introduced into the gas introduction pipe 17 via the gas line 17a at the timing of opening the valve 15e. The introduced plasma suppression gas is supplied into the internal flow path 44 and the junction exhaust pipe 45 through the gas introduction pipe 17.

The plasma processing device 100 may further include a controller 50. The controller 50 may be a computer including, for example, a processor, a storage part such as memory, an input device, a display device, and a signal input/output interface. The controller 50 controls each part of the plasma processing device 100. In the controller 50, an operator may perform, for example, a command input operation in order to manage the plasma processing device 100 using the input device. In addition, in the controller 50, the operation situation of the plasma processing device 100 may be visualized and displayed by the display device. The storage part stores a control program and recipe data. The control program is executed by the processor in order to execute various kinds of processes in the plasma processing device 100. The processor executes the control program so as to control each part of the plasma processing device 100 according to the recipe data.

[Branch Exhaust Pipe]

Next, the branch exhaust pipes 42 will be described. The flow path of each of the four branch exhaust pipes 42 has a mechanism 42a that deactivates the energy of hot electrons flowing through the flow path.

Figures 3A, 3B:
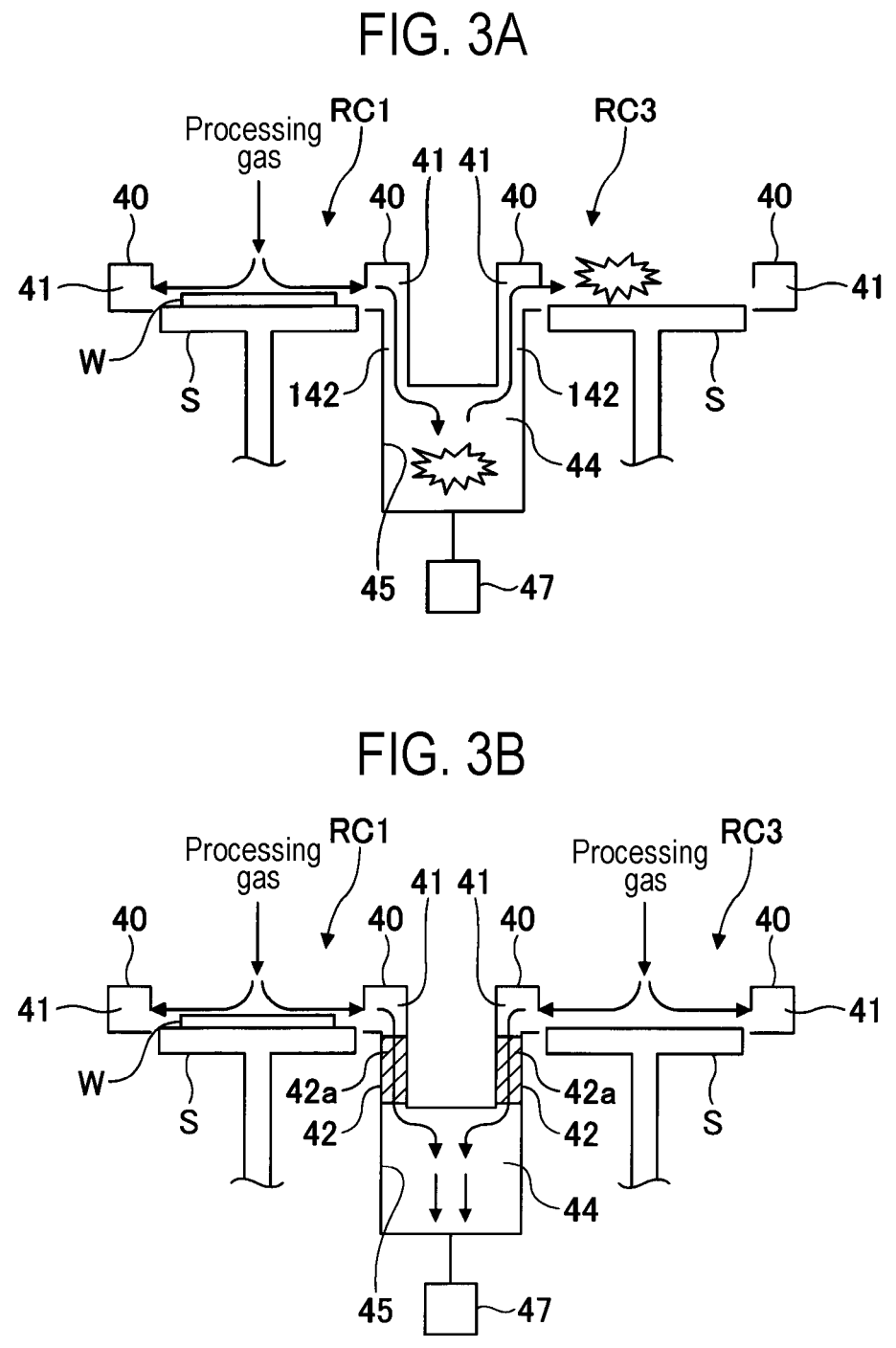
Figure 3C:
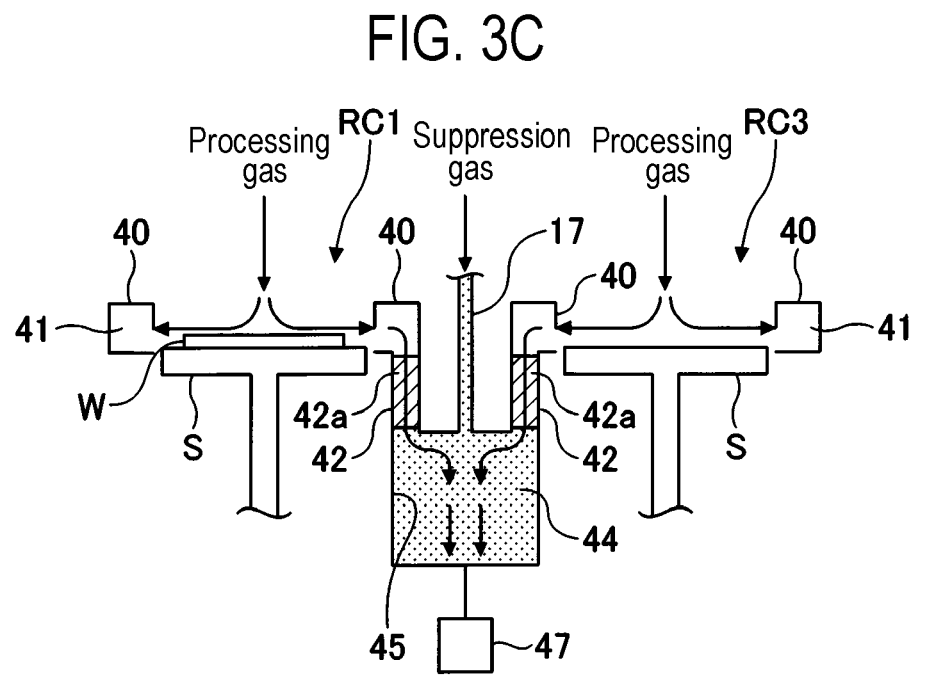

For example, as illustrated in FIG. 1, it is preferable for the mechanism 42a to form the flow path of the branch exhaust pipe 42 having a spiral shape. Preferably, the length of the spiral flow path is, for example, about twice or more of the length of the branch exhaust pipe 42 in the longitudinal direction indicated by "H" in FIG. 1. The reason will be described with reference to FIGS. 3A to 3C. FIG. 3A is a view illustrating plasma interference due to an exhaust route according to the comparative example. FIGS. 3B and 3C are views for explaining the prevention of plasma interference by the exhaust routes of the reactors RC1 to RC4 according to an embodiment. FIG. 3A illustrates a comparative example in which no branch exhaust pipe 42 is provided in the exhaust route of the reactors RC1 to RC4. FIGS. 3B and 3C illustrate examples of an embodiment in which branch exhaust pipes 42 are provided in the exhaust routes of the actors RC1 to RC4.

In FIGS. 3A to 3C, the reactor RC1 is supplied with a processing gas and radio-frequency power so that plasma is generated, and a substrate W is carried in and processed. The reactors RC2 to RC4 are not supplied with the processing gas and the radio-frequency power, and no substrate W is carried in and processed. However, the reactors RC2 to RC4 may be supplied with the processing gas. For example, when 25 non-processed substrates W are stored in one lot, as a result of processing the substrates W four by four at the same time in the reactors RC1 to RC4, the last one substrate W is processed by one of the four reactors RC, during which no substrate is carried into the other three reactor RC.

In such a situation, when plasma is generated in the reactor RC1, unintended plasma may be generated in the other reactors RC2 to RC4, the flow path of the junction exhaust pipe 45, and the vicinity thereof. When plasma is generated in another reactor RC, the flow path of the junction exhaust pipe 45, or the like, the radio-frequency power supplied to the reactor RC1 is consumed to generate unnecessary plasma, and thus the efficiency of using radio-frequency power for processing the substrates W is reduced. As a result, the processing of the last one substrate W in one lot has different characteristics compared with the processing of the other 24 substrates W in the same lot, so that variations will occur in the processing of the plurality of substrates W in the lot.

Meanwhile, by connecting the exhaust flow paths used for exhaust in the reactors RC from a plurality of branch exhaust pipes 42 to the junction exhaust pipe 45 so that the junction exhaust pipe 45 is commonly used, it is possible to downsize the plasma processing device 100 and to reduce the number of members of the exhaust system. This makes it possible to improve the footprint and reduce the cost. Therefore, in the plasma processing device 100 according to the embodiment, it is preferable to provide a junction exhaust pipe 45 so that the exhaust pipe is commonly used.

Therefore, in the plasma processing device 100 having a structure having a common exhaust pipe, it is important to avoid a plasma interference phenomenon in which plasma is generated inside or in the vicinity of a reactor RC, other than the reactor RC that is generating plasma, or the junction exhaust pipe 45, so unnecessary radio-frequency power is consumed and an abnormal discharge occurs. It is considered that hot electrons are involved in the phenomenon in which plasma is generated in a reactor RC, other than the reactor RC that is generating plasma, or the exhaust pipe. Hot electrons are electrons that have more energy than general electrons, and the phenomenon in which plasma is generated in another reactor is caused via the hot electrons.

For example, in the example of FIG. 3A, the electrons in the reactor RC1, which is generating plasma, become hot electrons due to heat input from the plasma or the like, and enter the junction exhaust pipe 45 from the exhaust manifolds 40 via the branch exhaust pipes 142. As a result, plasma may be generated in the junction exhaust pipe 45 by the energy of the hot electrons, and an abnormal discharge may occur. In addition, the hot electrons may enter other reactors RC through other branch exhaust pipes 142 communicating with the junction exhaust pipe 45, and plasma may be generated in the other reactors RC.

In contrast, in the plasma processing device 100 according to the present embodiment illustrated in FIG. 3B, the branch exhaust pipes 42 each have a mechanism 42a that forms a flow path having a spiral shape therein. This makes it possible to configure the flow path of the branch exhaust pipes 42 to have a length of, for example, about twice or more of the length of the branch exhaust pipes 42 in the longitudinal direction.

Figure 4:
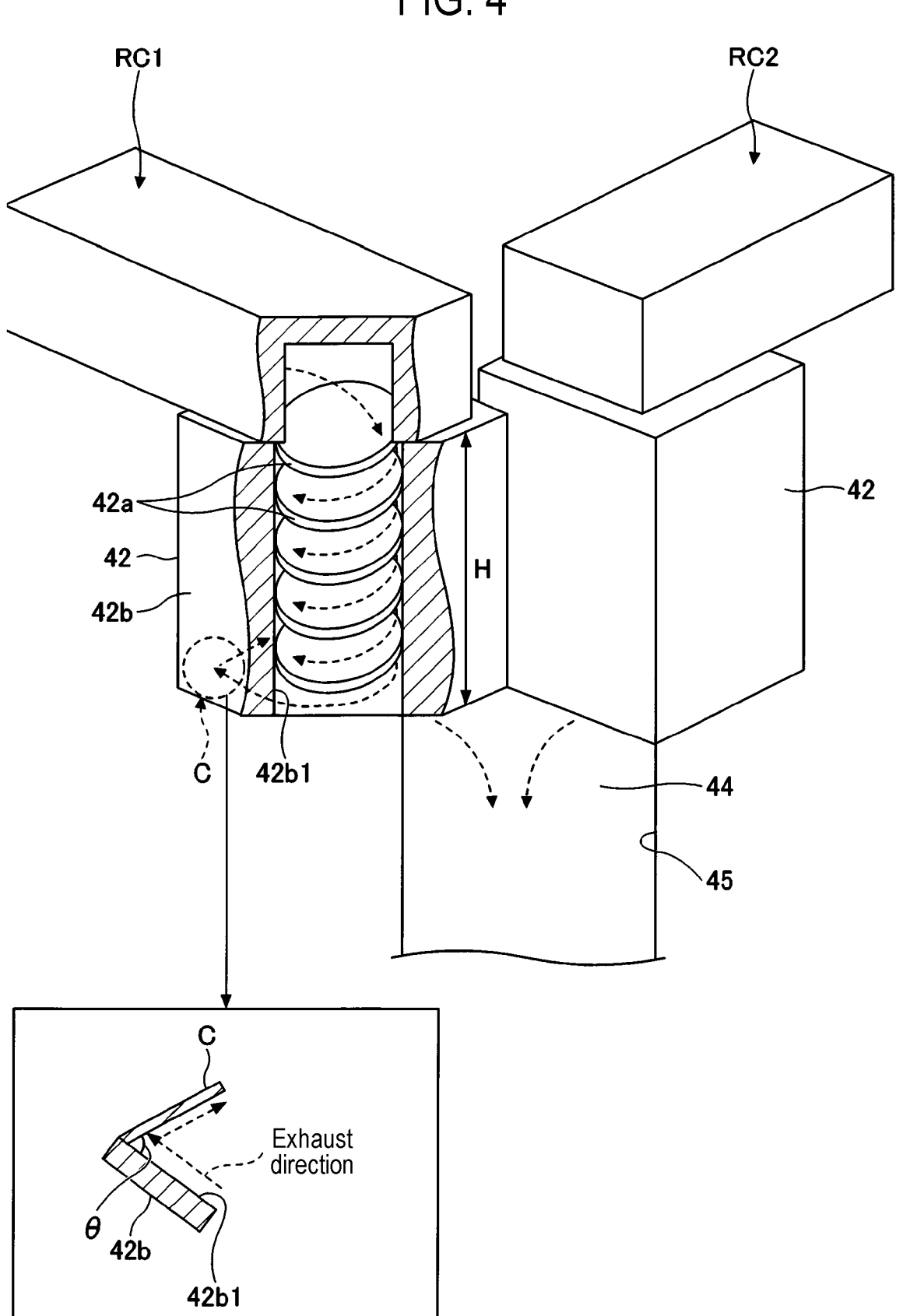
FIG. 4 is a view illustrating an example of a flow path of a branch exhaust pipe according to an embodiment.

FIG. 4 is a view illustrating an example of a flow path of a branch exhaust pipe 42 according to the embodiment. As illustrated in FIG. 4, the flow path of the branch exhaust pipe 42 is defined by a mechanism 42a forming a spiral shape and an outer wall 42b. The outer wall 42b and the mechanism 42a of the branch exhaust pipe 42 have a ground potential. That is, the side surface of the spiral flow path of the branch exhaust pipe 42 is formed by the outer wall 42b and becomes a ground surface. The outer wall 42b may be a substantially cylindrical or substantially rectangular member of the branch exhaust pipe 42. A portion or all of the outer wall 42b may be formed by a portion of each of inner side walls 12a of the reactors RC1 to RC4 of the container 12. When the length of the flow path of the branch exhaust pipe 42 is short, it is difficult to deactivate the energy of hot electrons by causing a large number of the hot electrons to collide with the ground surface of the outer wall 42b of the branch exhaust pipe 42.

However, the flow path of the branch exhaust pipe 42 according to the present embodiment is configured to have a length of, for example, about twice or more of the length H of the branch exhaust pipe 42 in the longitudinal direction by the mechanism 42a forming the spiral flow path. This makes it possible to increase the frequency of collision of a large number of hot electrons with the ground surface of the flow path of the branch exhaust pipe 42. As a result, the energy of hot electrons can be deactivated while the hot electrons flow through the flow path of the branch exhaust pipe 42. This makes it possible to prevent unintended plasma from being generated in another reactor RC adjacent to a reactor RC that processes a substrate when no substrate is processed in the another reactor RC. In addition, it is possible to prevent plasma from being generated inside or in the vicinity of the junction exhaust pipe 45.

In the plasma processing device 100 according to the embodiment illustrated in FIG. 3C, in addition to the mechanism 42a that forms the flow path of the branch exhaust pipe 42 having a spiral shape, a plasma suppression gas is introduced into the junction exhaust pipe 45 from the gas introduction pipe 17. The plasma suppression gas is a gas in which plasma is difficult to generate. This makes it possible to prevent the processing gas from staying inside or in the vicinity of the junction exhaust pipe 45. In addition, it is possible to more effectively prevent plasma from being generated inside or in the vicinity of another adjacent reactor RC and the junction exhaust pipe 45.

The plasma suppression gas is a gas in which plasma is difficult to generate, and it is preferable to supply any one of $O_2$ gas, $NF_3$ gas, and $F_2$ gas, or a combination thereof.

A processing gas (a raw material gas or a reactive gas) used for substrate processing and an inert gas such as Ar gas that promotes plasma ignition are supplied into a reactor RC that is under processing. For example, when Ar gas flows into the junction exhaust pipe 45, the generation of unintended plasma is promoted in another reactor RC. However, it is not possible to stop the supply of Ar gas supplied to promote plasma ignition in a reactor RC that processes a substrate. In addition, when a gas supply system is shared between the reactors RC, it is not possible to supply a gas, which is different from the gas supplied to a reactor RC that processes a substrate, to an adjacent reactor RC that does not process a substrate.

Therefore, in the present embodiment, in order to suppress Ar gas supplied into a reactor RC from staying inside the junction exhaust pipe 45 and suppress the generation of plasma in the junction exhaust pipe 45 and in an adjacent reactor RC, a plasma suppression gas is supplied into the junction exhaust pipe 45. This makes it possible to prevent Ar gas from staying inside the junction exhaust pipe 45 and to prevent plasma from being generated in the junction exhaust pipe 45 and in the adjacent reactor RC.

The dotted arrows in FIG. 4 indicate the flow of hot electrons. As described above, the spiral flow path in the branch exhaust pipe 42 is defined by the mechanism 42a and the outer wall 42b, the outer wall 42b and the mechanism 42a have a ground potential, and the inner surface 42b1 of the outer wall 42b is a ground surface. The outer wall 42b may be a substantially cylindrical member surrounding the mechanism 42a, or may be a wall of a step portion formed on each inner side wall 12a of each reactor RC of the container 12 illustrated in FIG. 1. When the outer wall 42b is a substantially cylindrical member, the branch exhaust pipe 42 is fixed to the inner side wall 12a.

The branch exhaust pipe 42 causes hot electrons to collide with the inner surface 42b1 of the flow path to deactivate the energy of the hot electrons. For this purpose, the flow path of the branch exhaust pipe 42 is made spiral to increase the distance of the flow path. For example, when the length of the branch exhaust pipe 42 in the longitudinal direction (the height H in the vertical direction of the branch exhaust pipe 42 in FIG. 4) is 150 mm, the length of the flow path of the branch exhaust pipe 42 is preferably at least twice or more of the length of the branch exhaust pipe 42 in the longitudinal direction, that is, 300 mm or more, and more preferably 400 mm or more. As a result, the frequency of collision of hot electrons with the ground surface of the flow path of the branch exhaust pipe 42 is increased without deteriorating the conductance of the branch exhaust pipe 42, and the energy of the hot electrons flowing through the flow path of the branch exhaust pipe 42 is deactivated. By configuring the flow path of the branch exhaust pipe 42 in the spiral shape, it is possible to achieve both deactivation of hot electrons and conductance of exhaust gas in the branch exhaust pipe 42.

In addition, there is a grounded baffle plate C that faces the outlet of the flow path of the branch exhaust pipe 42 illustrated in FIG. 4 at an angle θ of 90° or less with respect to the exhaust direction of the spiral exhaust flow path formed by the mechanism 42a so that hot electrons collide with the grounded baffle plate C. The inside of the frame of FIG. 4 illustrates the exhaust direction of gas and the flow of hot electrons when the baffle plate C is viewed from above. The angle θ between the baffle plate C and the inner surface 42b1 of the outer wall 42b of the branch exhaust pipe 42, which is the exhaust direction of the spiral flow path at the outlet of the flow path of the branch exhaust pipe 42, is 90° or less. This makes it possible to reduce the energy of hot electrons and more reliably deactivate the hot electrons by causing the hot electrons to collide with the baffle plate C of the branch exhaust pipe 42.

In order to lengthen the distance of the flow path in the limited space inside the branch exhaust pipe 42, instead of configuring the exhaust flow path in the spiral shape, a method of forming the flow path of the branch exhaust pipe 42 by using two or more partition plates or providing a labyrinth structure in the branch exhaust pipe 42 may be considered. However, in the flow path formed by using two or more partition plates and the flow path having a labyrinth structure, the conductance of the flow path is remarkably deteriorated. Furthermore, in experiments conducted with a branch exhaust pipe 42 in which a flow path is formed by using two or more partition plates and a branch exhaust pipe 42 in which a flow path having a labyrinth structure is formed, the effect of sufficiently deactivating hot electrons in the branch exhaust pipes 42 was not obtained.

In addition, a method of forming exhaust ports at positions where a piping route from the exhaust flow path 41 of the exhaust manifold 40 of each reactor RC to the junction exhaust pipe 45 becomes long, for example, at the four corners of the bottom of the container 12 of the plasma processing device 100 may be considered. However, in this case, a pipe interconnecting the exhaust flow path 41 of the exhaust manifold 40 and the junction exhaust pipe 45 from the outside of each reactor RC is required, which causes an increase in the size of the plasma processing device 100. Therefore, neither method can be adopted.

Therefore, in the plasma processing device 100 according to the present embodiment, hot electrons are deactivated by forming a limited space within the branch exhaust pipe 42 in a spiral shape. However, the mechanism for deactivating hot electrons is not limited to the mechanism 42a that forms a flow path having a spiral shape in the branch exhaust pipe 42, but may be, for example, a mechanism having a plurality of protrusions protruding from the outer wall 42b into the flow path of the branch exhaust pipe 42.

[Plasma Processing Method]

Figure 5:
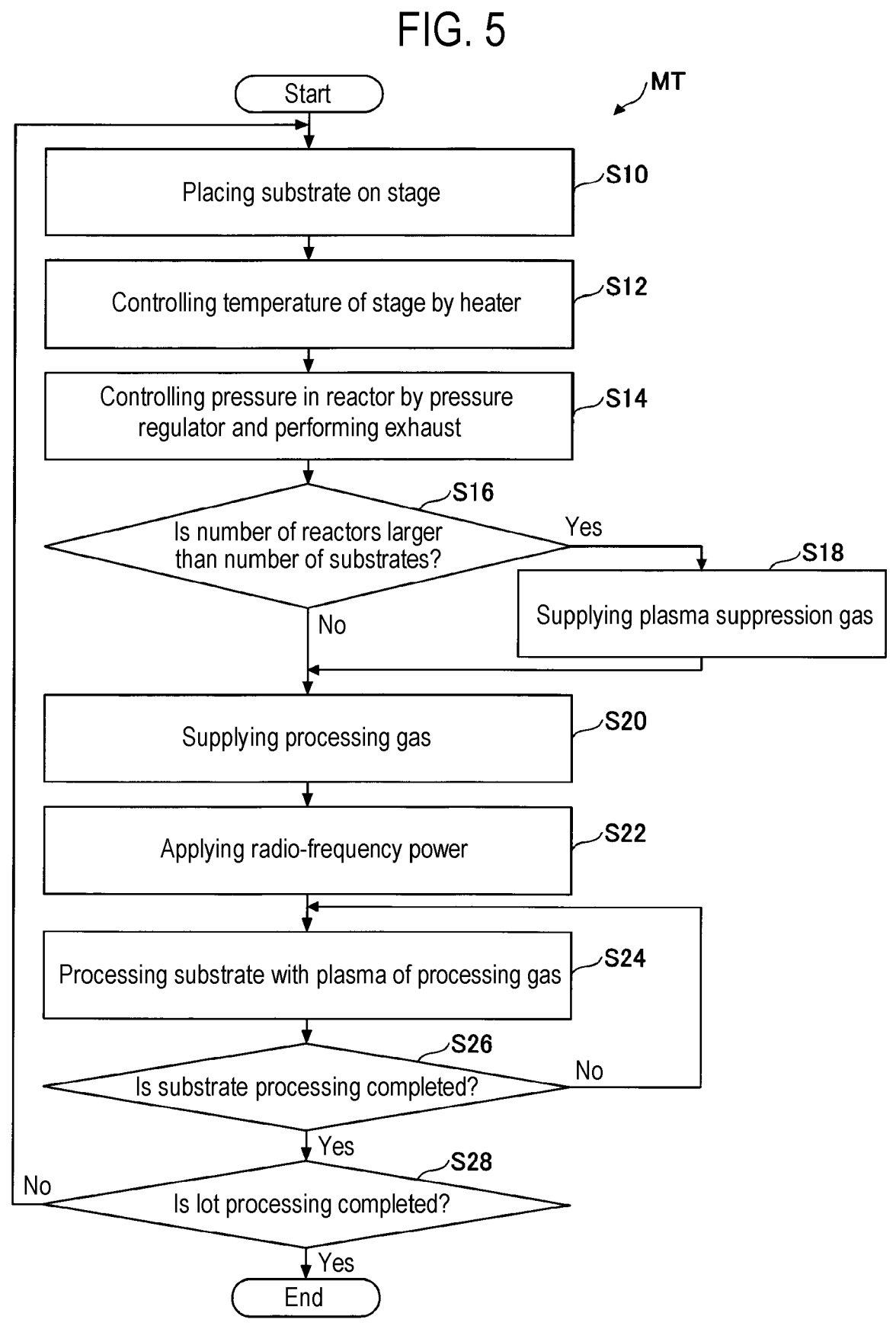

Next, with reference to FIG. 5, a plasma processing method according to an embodiment, which is executed by using the plasma processing device 100, will be described. FIG. 5 is a flowchart illustrating a plasma processing method (hereinafter, also referred to as a "method MT") according to an embodiment. This processing is controlled by the controller 50.

When this processing is started, the controller 50 places substrates W on the stages S (step S10). Next, the controller 50 controls the temperature of the stage S by the heater 20 in the stage S (step S12). Next, the controller 50 controls the pressure in the reactors RC by the pressure regulator 46 and performs exhaust (step S14).

Next, the controller 50 determines whether the number of reactors RC in the plasma processing device 100 is larger than the number of substrates W placed on the stages S (step S16). When the number of reactors RC is larger than the number of substrates W placed on the stages S, a plasma suppression gas is supplied into the junction exhaust pipe 45 from the gas source 15a via the gas introduction pipe 17 (step S18), and the process proceeds to step S20. Meanwhile, when the number of reactors RC is equal to or less than the number of substrates W placed on the stages S in step S16, the process proceeds to step S20.

Next, the controller 50 introduces a processing gas and Ar gas into the container 12 from the gas source 15a through the gas introduction port 18 (step S20), and applies radio-frequency power from the radio-frequency power supply 36 (step S22). Next, the controller 50 performs a desired process on the substrates W by the plasma of the supplied processing gas and Ar gas (step S24).

Next, the controller 50 determines whether the processing of the substrates W is completed (step S26). The controller 50 processes the substrates W until the processing of the substrates W is completed (step S24), and when it is determined that the processing of the substrates W is completed, it is determined whether lot processing is completed (step S28). The completion of lot processing is determined based on whether or not the processing of all the substrates in the lot is completed. When it is determined that the lot processing is not completed, the controller 50 returns to step S10 and performs the processing of steps S10 to S28 on the next substrates. When it is determined that the lot processing is completed, this processing is terminated.

As described above, according to the plasma processing device and the plasma processing method according to the present embodiment, it is possible to prevent plasma interference via exhaust spaces in a plurality of reactors RC having a common exhaust flow path.

It should be understood that the plasma processing device and the plasma processing method according to the embodiments disclosed herein are exemplary in all aspects and not restrictive. The above-described embodiments may be modified and improved in various forms without departing from the scope and spirit of the appended claims. The matters described in the above embodiments may take other configurations within the non-contradictory range, and may be combined within the non-contradictory range.

The plasma processing device of the present disclosure is not limited to the plasma processing device illustrated in FIG. 1, as long as it is an apparatus having a plurality of processing chambers and having a plurality of branch exhaust pipes for evacuating the plurality of processing chambers, respectively, and a junction exhaust pipe which is a common pipe to which the plurality of branched exhaust pipes is connected. In addition, the substrate processing executed in the plurality of processing chambers is not limited to film forming processing, and may be processing such as etching and cleaning.

The present international application claims priority based on Japanese Patent Application No. 2020-030328 filed on Feb. 26, 2020, the disclosure of which is incorporated herein in its entirety by reference.

EXPLANATION OF REFERENCE NUMERALS

1: chamber, 11: lid, 12: container, 13: O-ring, 14: upper electrode, 15: gas supplier, 16: gas supply hole, 17: gas introduction pipe, 20: heater, 21: electrode plate, 22: support, 35: lifting mechanism, 36: radio-frequency power supply, 40: exhaust manifold, 41: exhaust flow path, 42: branch exhaust pipe, 42a: mechanism, 45: junction exhaust pipe, 47: exhaust apparatus, 50: controller, 100: plasma processing device, RC, RC1 to RC4: reactor, S: stage

What is claimed is:

1. A plasma processing device comprising:
a plurality of processing chambers;
a junction exhaust pipe into which a plurality of exhaust flow paths joins; and
a plurality of branch exhaust pipes disposed between the plurality of exhaust flow paths and the junction exhaust pipe and connecting the junction exhaust pipe to the plurality of exhaust flow paths, respectively; and
a grounded baffle plate,
wherein the plurality of exhaust flow paths is configured to evacuate interiors of the plurality of processing chambers,
wherein each of the plurality of branch exhaust pipes includes a mechanism, which is disposed in a flow path of the branch exhaust pipe, configured to deactivate energy of hot electrons flowing through the flow path,
wherein the mechanism is configured to form the flow path of the branch exhaust pipe in a spiral shape, and
wherein the grounded baffle plate faces an outlet of the flow path of the branch exhaust pipe having the spiral shape at an angle of 90 degrees or less with respect to an exhaust direction of the flow path so as to collide with hot electrons.

2. The plasma processing device of claim 1, wherein the mechanism is configured such that a length of the flow path of the branch exhaust pipe is twice or more of a length of the branch exhaust pipe in a longitudinal direction.

3. The plasma processing device of claim 1, wherein an outer wall defining the flow path has a ground potential.

4. The plasma processing device of claim 3, wherein the mechanism has a ground potential.

5. The plasma processing device of claim 4, further comprising:
an introduction pipe configured to communicate with a flow path of the junction exhaust pipe and introduce a gas for suppressing occurrence of plasma.

6. The plasma processing device of claim 1, wherein an outer wall defining the flow path has a ground potential.

7. The plasma processing device of claim 1, wherein the mechanism has a ground potential.

8. The plasma processing device of claim 1, further comprising:
an introduction pipe configured to communicate with a flow path of the junction exhaust pipe and introduce a gas for suppressing occurrence of plasma.

* * * * *